(12) United States Patent
Noll (10) Patent No.: US 8,614,600 B2
(45) Date of Patent: Dec. 24, 2013

(54) SWITCH CONFIGURATION FOR DEFAULT-ON N-WAY ACTIVE SPLITTERS

(75) Inventor: Alan L. Noll, Nashua, NH (US)

(73) Assignee: M/A-COM Technology Solutions Holdings, Inc., Lowell, MA (US)

( * ) Notice: Subject to any disclaimer, the term of this patent is extended or adjusted under 35 U.S.C. 154(b) by 51 days.

(21) Appl. No.: 13/402,340

(22) Filed: Feb. 22, 2012

(65) Prior Publication Data

US 2013/0214859 A1    Aug. 22, 2013

(51) Int. Cl.
*H03F 1/14*    (2006.01)
(52) U.S. Cl.
USPC ............................................. 330/51; 330/148
(58) Field of Classification Search
USPC .................................... 330/51, 148
See application file for complete search history.

(56) References Cited

U.S. PATENT DOCUMENTS 7,259,619 B2 *    8/2007    Chang et al. .................... 330/51

OTHER PUBLICATIONS

Noll, Alan, et al., "A Novel Integrated DPDT and 3-Way Active Splitter With A Unique Unpowered Loop Through State For Broadband Applications", published Oct. 2009, pp. 270-273, Microwave Integrated Circuits Conference, 2009, EuMIC 2009, European.

* cited by examiner

*Primary Examiner* — Robert Pascal
*Assistant Examiner* — Khiem Nguyen
(74) *Attorney, Agent, or Firm* — Christopher P. Maiorana, PC (57) ABSTRACT

An apparatus comprising an amplifier and a switch network. The amplifier may be configured to generate a plurality of output signals in response to an input signal. The switch network may be configured to provide (i) a first path when a power signal is not present and (ii) a second path when said power signal is present. The first path may activate a first of the plurality of output signals. The second path may activate all of the plurality of output signals. An impedance may be connected to the amplifier only when the first path is activated.

17 Claims, 11 Drawing Sheets

SWITCH CONFIGURATION FOR DEFAULT-ON N-WAY ACTIVE SPLITTERS

FIELD OF THE INVENTION

The present invention relates to splitters generally and, more particularly, to a method and/or apparatus for implementing a splitter with a switch configuration for implementing default-on N-way active splitter.

BACKGROUND OF THE INVENTION

Conventional broadband splitters implement a reflective switch element between an input and an amplifier path. Such a configuration has been used in an N-way active splitter, such as M/A-COM Technology Solutions Holdings, Inc, Part No. MAAM-009879 (2-way), MAAM-009450 (3-way), MAAM-009778 (4-way), MAAM-009779 (5-way), MAAM-010263 (6-way) and MAAM-010237 (8-way). An example of such a design can be found in publication "A Novel Integrated DPDT and 3-Way Active Splitter With A Unique Unpowered Loop through State For Broadband Applications", published October 2009, on pages 270-273 of Microwave Integrated Circuits Conference, 2009, EuMIC 2009, European, the appropriate portions of which are hereby incorporated by reference. When the switch is off, or isolated, the path is not terminated in the characteristic impedance of the system. In the unbiased state of operation, the isolation of the amplifier switch is limited to the off impedance of the circuit. The switch is terminated with the impedance of the amplifier when in the unbiased state. At certain frequencies, a resonance can occur in the default-on insertion loss, output to input isolations, and output to output isolations of such an active splitter.

It would be desirable to implement a broadband switch that eliminates resonance drawbacks and/or extends the operating frequency range while still maintaining device functionality.

SUMMARY OF THE INVENTION

The present invention concerns an apparatus comprising an amplifier and a switch network. The amplifier may be configured to generate a plurality of output signals in response to an input signal. The switch network may be configured to provide (i) a first path when a power signal is not present and (ii) a second path when said power signal is present. The first path may activate a first of the plurality of output signals. The second path may activate all of the plurality of output signals. An impedance may be connected to the amplifier only when the first path is activated.

The objects, features and advantages of the present invention include providing a splitter that may (i) provide a default-on path, (ii) provide an N-way active splitter, (iii) extend an operating range of the outputs of the splitter, (iv) provide a low insertion loss path to the amplifier which does not effect the noise figure, and/or (v) provide a circuit which does not effect the fidelity (e.g., distortion, linearity, etc.) of the input signal.

BRIEF DESCRIPTION OF THE DRAWINGS

These and other objects, features and advantages of the present invention will be apparent from the following detailed description and the appended claims and drawings in which:

DETAILED DESCRIPTION OF THE PREFERRED EMBODIMENTS

Figure 1:
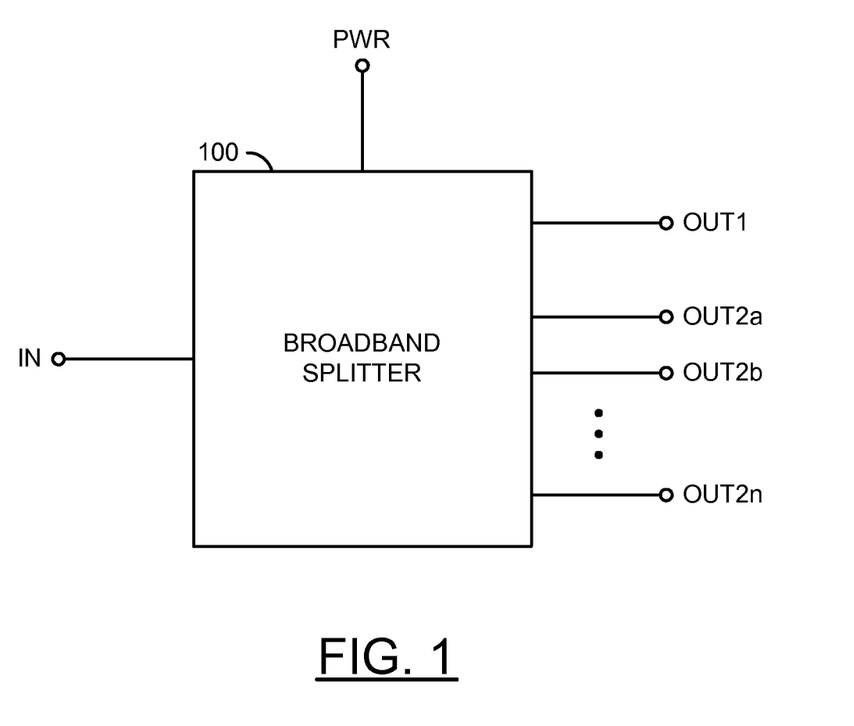
FIG. 1 is a block diagram of the present invention.

Referring to FIG. 1, a block diagram of an apparatus 100 in accordance with an embodiment of the present invention is shown. The apparatus 100 may be implemented as a circuit, such as a broadband splitter circuit. In one example, the circuit 100 may be implemented as a splitting device that may be used after a coaxial (or fiber, copper twisted pair, etc.) cable enters a residential (or business) or other end-user premise. The circuit 100 may receive a signal (e.g., IN) and may present a signal (e.g., OUT1), and a number of signals (e.g., OUT2a-OUT2n). In general, the signal OUT1, and the signal OUT2a-OUT2n may be electrical duplicates of the signal IN. The signal OUT1 and/or the signals OUT2a-OUT2n may be used by various components (e.g., television set top boxes, a broadband gateway, a broadband router, etc.).

In one example, the signal IN may be a signal received from a cable company, phone company or other broadband provider. The signal OUT1 may be a default-on signal that may be active when power (e.g., AC power) to the premise is not available, such as during a storm or other types of power outage. The signals OUT2a-OUT2n may be additional splitter signals that may be provided when AC power is available. The circuit 100 may allow a component connected to the signal OUT1 to have priority that may be used in a power outage situation. Such an implementation may be an advantage when a residential (or business) customer needs to operate a limited number of devices (such as a telephone, portable computer, etc.) during a power outage event. In general, only the output signal OUT1 would be operational during a power outage in an effort to conserve battery power. The apparatus 100 may use a minimum (or reduced) amount of battery power when only generating the default-on signal OUT1. While a telephone has been described as being a device that may be desirable to connect to the signal OUT1, a particular customer may decide to implement any device (e.g., a battery-operated television, personal computer, alarm system, etc.) to the signal OUT1. The particular device connected to the signal OUT1 may be varied to meet the design criteria of a particular implementation.

Figure 2A:
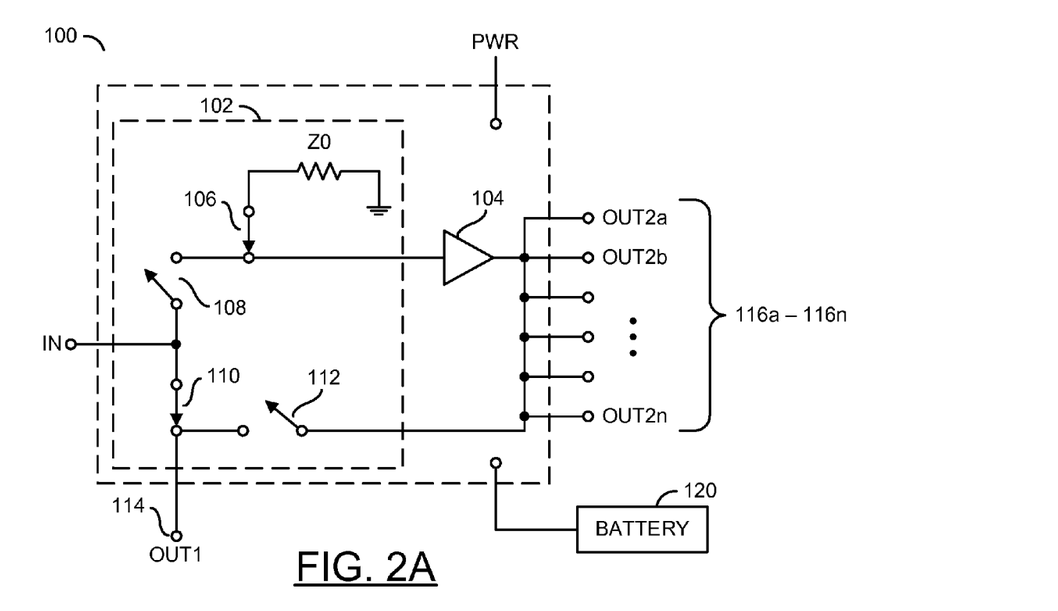
FIGS. 2A and 2B are diagrams of the present invention.

Referring to FIG. 2A, a conceptual implementation where only the signal OUT1 is activated in a power outage type situation is shown. The circuit 100 generally comprises a block (or circuit) 102 and a block (or circuit) 104. The circuit 102 may be implemented, in one example, as a switching network. The circuit 104 may be implemented, in one example, as an amplifier circuit, and/or power splitter. The amplifier/power splitter circuit 104 may be implemented to avoid potential signal loss between the signal IN and the signal OUT2a-OUT2n.

The circuit 102 generally comprises a device 106, a device 108, a device 110, a device 112 and a device Z0. A device Z0 may be implemented as a resistance (or impedance). The impedance Z0 may be implemented, in one example, as a thin film resistor having a value that may be close to a value of a system impedance. In the example of a cable TV implementation, the impedance Z0 may be implemented to have a target impedance of 75 Ohms. However, the particular value of the impedance Z0 may be varied to meet the design criteria of a particular implementation. For example, certain systems may have a system impedance of 50 Ohms. The final value of the impedance Z0 may be selected during the design or fabrication process in an effort to ensure an input return loss parameter specification has been met (to be described in more detail in connection with FIG. 10).

The devices 106, 108, 110 and 112 may be implemented, in one example, as switches. When a signal (e.g., PWR) is not present (e.g., during a power loss), a path from the signal IN to the signal OUT1 may be activated (e.g., a default-on condition). In such an implementation, the amplifier 104 is disabled and the resistor Z0 (which may represent a resistance, impedance, etc.) is generally connected between an input to the amplifier 104 and ground.

Figure 2B:
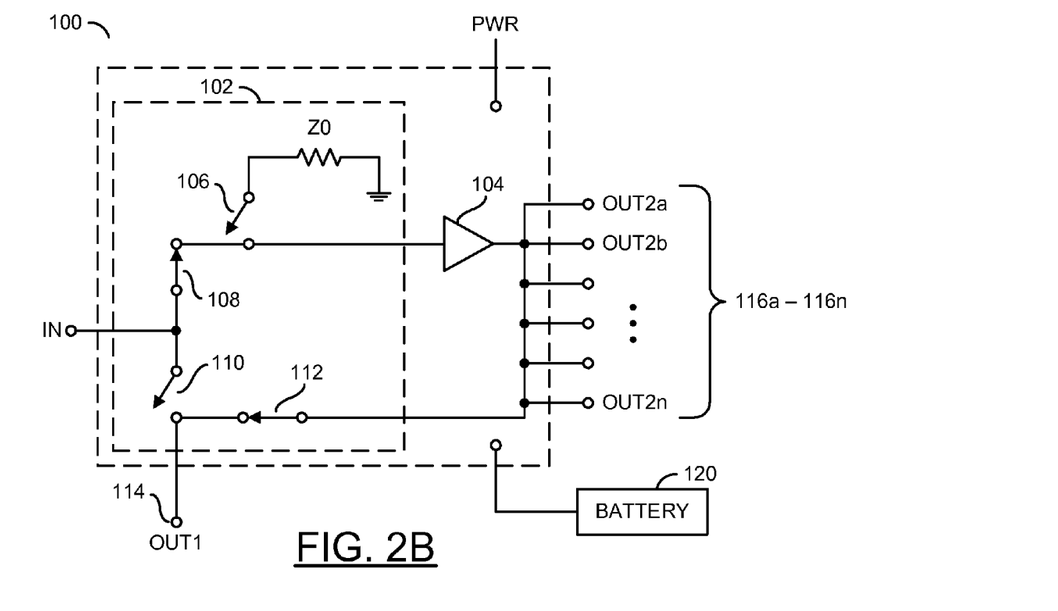

Referring to FIG. 2B, a conceptual implementation where the signal PWR is present is shown. In such a situation, a path is activated from the signal IN, through switch 108, to the amplifier 104. In such an implementation, the switch 106 may be open, which generally removes the impedance Z0 from the path to the input of amplifier 104. In general, the circuit 104 may allow the signal OUT1 to operate (e.g., from power received from a battery 120 or other backup power source) when the signal PWR is not present. When the signal PWR is present, the circuit 104 may activate all the outputs OUT1 and OUT2a-OUT2n.

Figure 3:
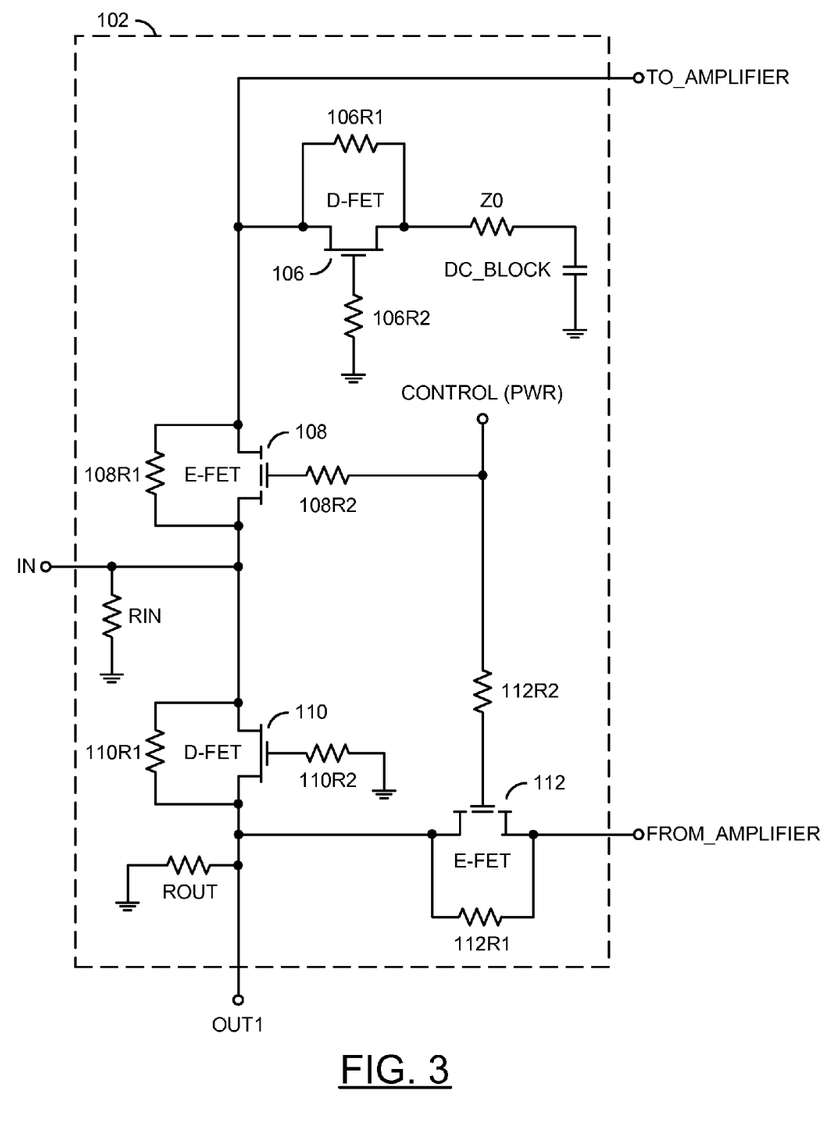
FIG. 3 is a more detailed diagram of the circuit of FIG. 1.

Referring to FIG. 3, a more detailed diagram of the circuit 102 is shown. The device 106 is shown implemented as a D-FET transistor (e.g., a depletion mode device). In one example, the device 106 may be implemented as a pHEMT D-type active device. However, the particular type of device 106 may be varied to meet the design criteria of a particular implementation. For example, the circuit 102 may be implemented as other types of devices to implement a switch function. For example, PIN diodes and/or HBT active devices may be implemented. A resistor 106R1 may be connected in parallel to the drain and source of the device 106. A resistor 106R2 may be connected between OUT1 and the ground connection of the device 106. The resistor Z0 may be connected between the device 106 and ground through a capacitor (e.g., DC_BLOCK). The device 106 may be implemented as a "normally on" type device. For example, without power to the device 106, a connection between the drain and source is normally made.

The device 108 may be implemented as a E-FET transistor. In one example, the device 108 may be implemented as a pHEMT E-type active device. However, the particular type of device implemented may be varied to meet the design criteria of a particular implementation. A resistor 108R1 may be connected across the source and drain of the device 108. A resistor 108R2 may be connected between a gate of the device 108 and a signal (e.g., CONTROL). The signal CONTROL may be a power signal, such as a DC logic source (e.g., that may be generated in response to AC service provided to the premise). The device 108 may be implemented as an enhancement type device. The device 108 may be a "normally off" type device. For example, when a signal is not presented at the gate of the device 108, the source and drain are normally not connected.

The signal IN may be connected between a drain of the device 108 and a source of the device 110. A resistor (e.g., RIN) may be connected between the signal IN and ground. The device 110 may be implemented as a D-FET type transistor. A resistor (e.g., 110R1) may be connected between a source and a drain of the device 110: The gate of the device 110 may be connected to ground through a resistor (e.g., 110R2). The drain of the device 110 may be connected to the signal OUT1. A resistor (e.g., ROUT) may be connected between the drain of the device 110 and ground. The device 112 may be implemented as an E-FET type transistor. A resistor (e.g., 112R1) may be connected between the source and drain of the device 112. A resistor (e.g., 112R2) may be connected between a gate of the device 112 and the signal CONTROL. A drain of the device 112 may be connected to the signal (e.g., FROM_AMPLIFIER.

The switch network 102 may prevent a resonance from occurring on the signal OUT1 and/or the signals OUT2a-OUT2n (to be described in more detail in connection with FIGS. 9-12). During the fully biased condition of the circuit 100, the termination element Z0 may be a shunt high impedance and may have limited effect on the noise figure, input return loss, and/or gain. During the no bias (or unbiased) condition of the active splitter 100, the termination FET switch 106 is normally ON and the amplifier switch 108 is terminated in the system characteristic impedance. The termination element Z0 may reduce and/or eliminate potential resonances which may occur in conventional designs over extended operating frequency ranges. For example, the device Z0 and/or the switch 106 may be implemented to have values that may be selected to avoid affecting a noise figure and/or signal fidelity (e.g., linearity and/or distortion) of the circuit 100. Specific parameters considered may be the output $2^{nd}$ order intercept point (OIP2), and/or output $3^{rd}$ order intercept point (OIP3), composite second order (CSO) and/or composite triple beat (CTB). These and other parameters may be optimized by selecting the size (or gate periphery) of the switches 106, 108, 110 and/or 112.

Figure 4:
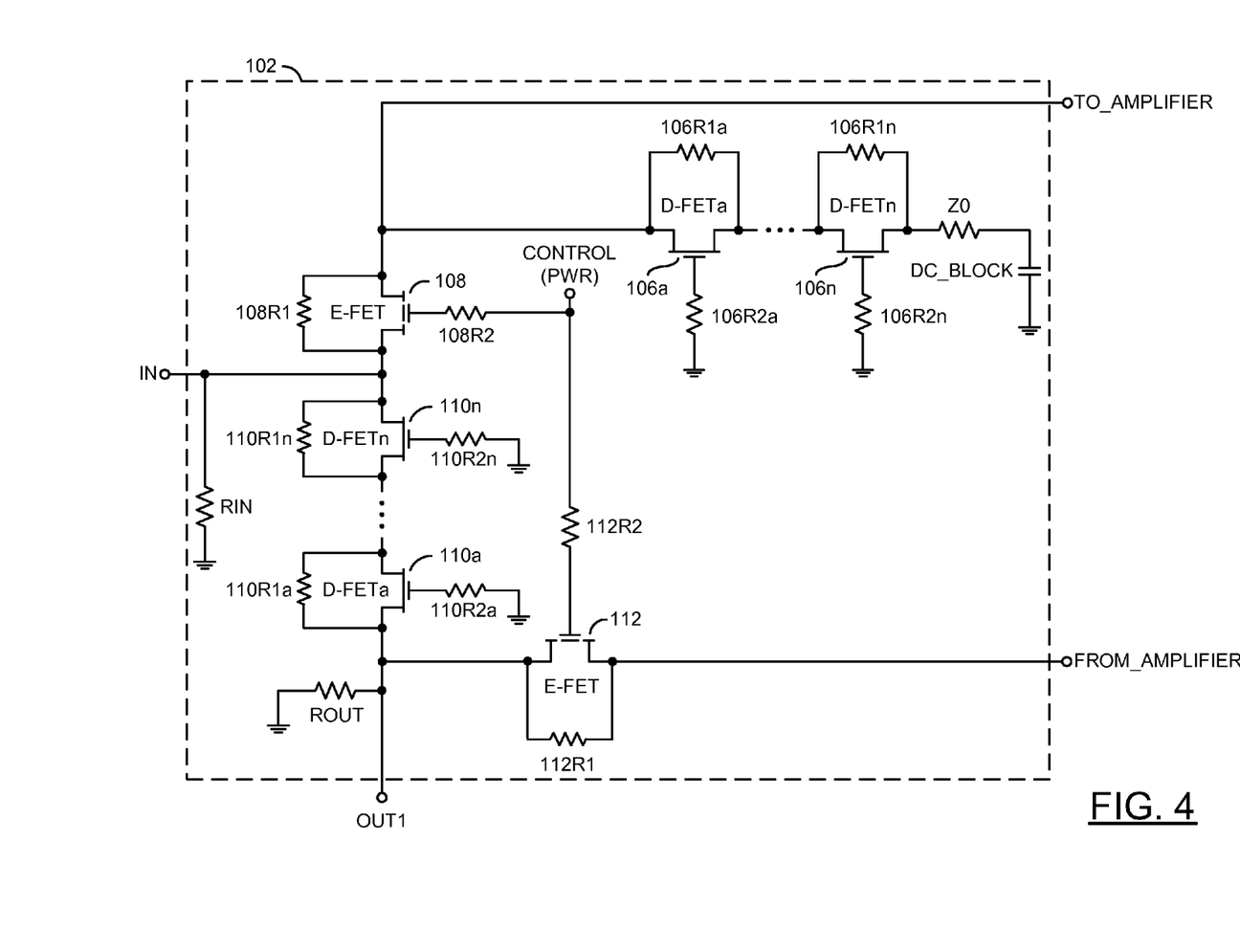
FIG. 4 is a diagram of an alternate implementation of the circuit of FIG. 3.

Referring to FIG. 4, an alternate implementation of the circuit 102' is shown. Additional D-FET devices are shown as 106a-106n. Similarly, additional E-type devices are shown as the devices 110a-110n. By implementing a plurality of devices 106a-106n and a plurality of devices 110a-110n, additional isolation may be implemented. While additional D-type devices may be desirable, the E-type devices may preferably be implemented as a single device for the device 108 and/or the device 112. Additional E-FETs may be implemented in certain design implementations, but at the possible expense of an increase in the insertion loss of the path and/or the effective noise figure on the path of the amplifier 104.

Figure 5A:
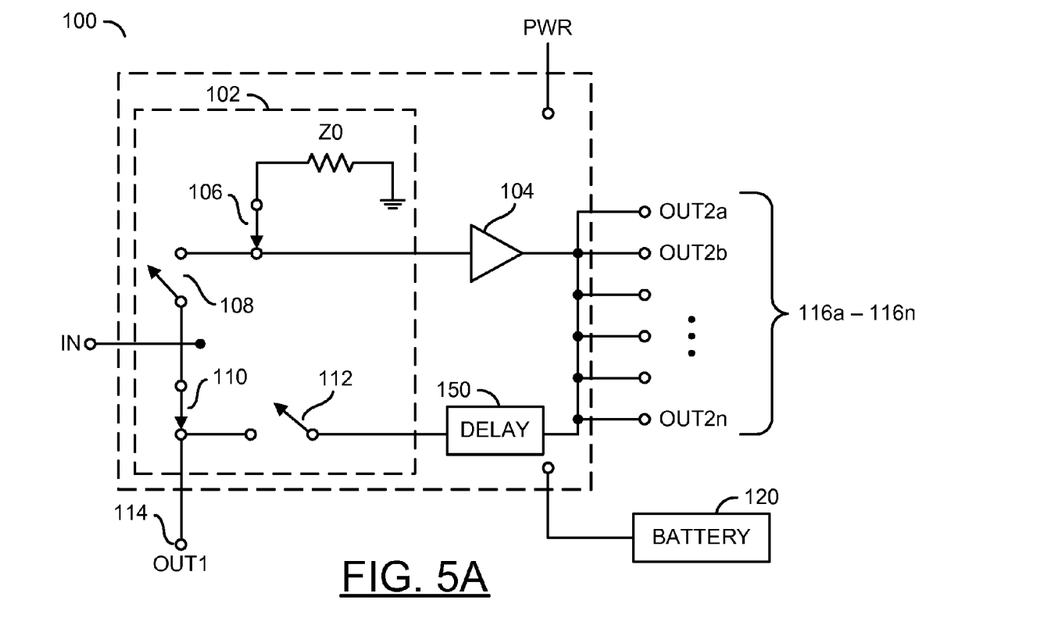
FIGS. 5A and 5B are diagrams of an alternate circuit of FIGS. 2A and 2B.
Figure 5B:
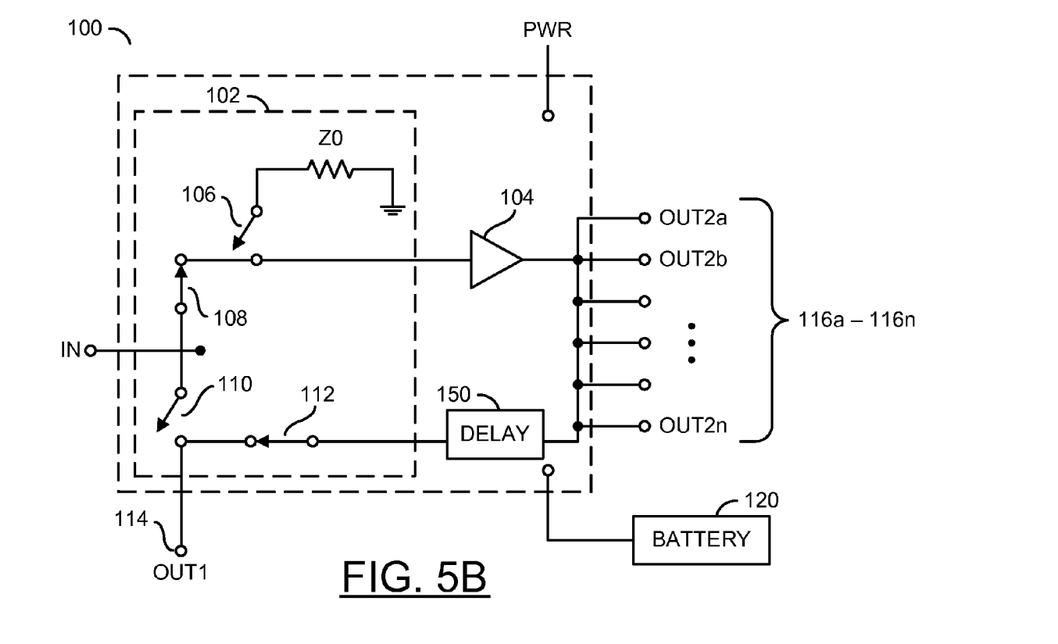

Referring to FIGS. 5A and 5B, an alternate implementation of the circuit 100' is shown. A delay block 150 is shown. The delay block 150 may be used to compensate for the phase difference (or electrical differences) between the signals OUT2a-OUT2n and the signal OUT1. A variety of implementations of the delay circuit 150 may be implemented. In general, the delay block 150 may be implemented such that the electrical differences and/or frequency bandwidth of the overall circuit 100' are not diminished. Such a delay may be practical over a narrow bandwidth.

Figure 6:
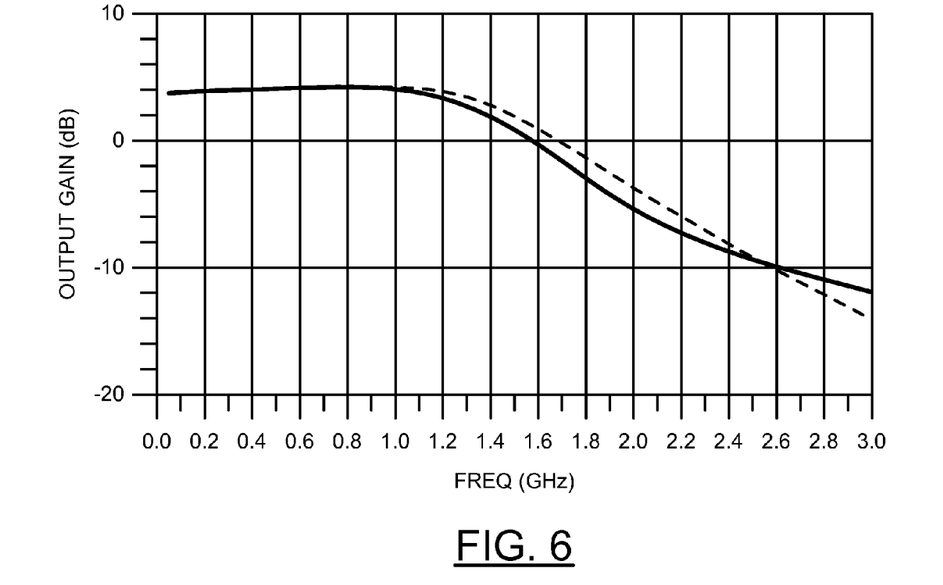
FIG. 6 is a simulated performance of the conventional approach versus the present invention.

Referring to FIG. 6, a simulated performance of a conventional approach versus the present invention is shown. The simulation shows key parameters in a bias state of an N-way active splitter. An output gain versus frequency is shown up to 3 GHz. The present invention is shown with a solid line. The conventional approach is shown with a dotted line.

Figure 7:
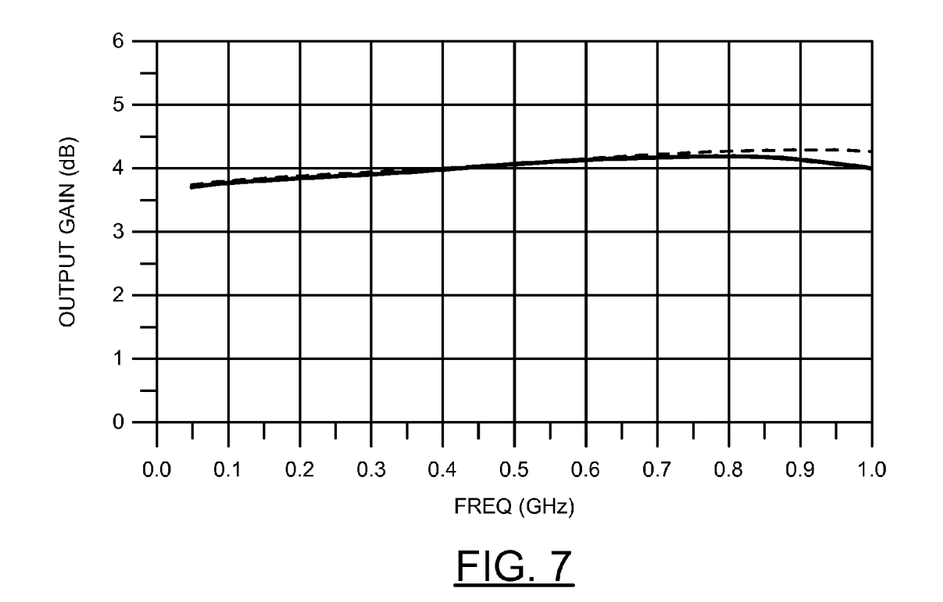
FIG. 7 is a simulated performance of a conventional approach versus the present invention.

Referring to FIG. 7, a simulated performance of a conventional design versus the present invention is shown. A bias state is simulated in an N-way active splitter. An output gain is shown versus frequency up to 1 GHz. The present invention is shown with a solid line. The conventional approach is shown with a dotted line.

Figure 8:
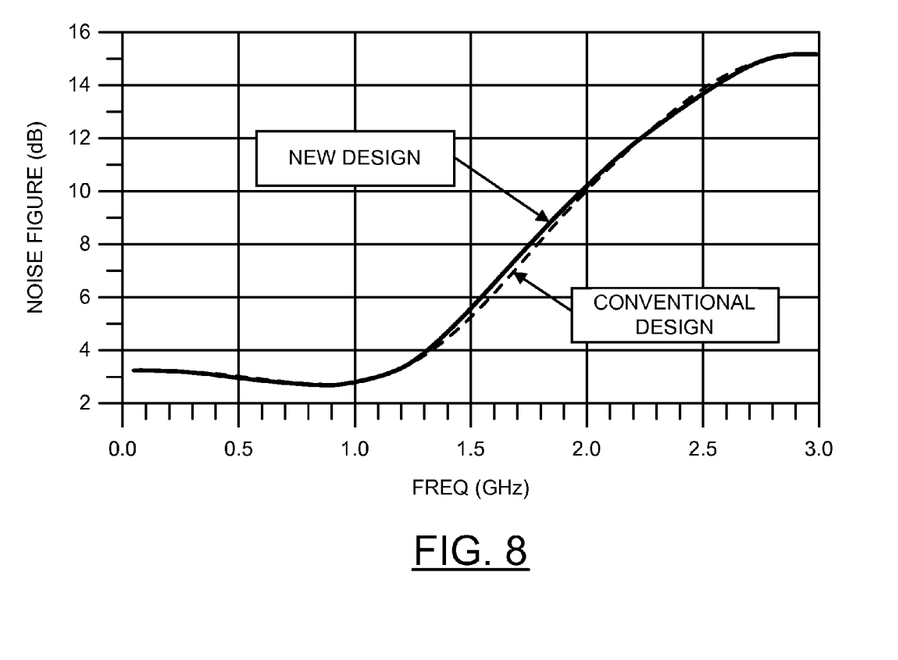
FIG. 8 is a simulated performance of a conventional approach versus the present invention.

Referring to FIG. 8, a diagram of a simulated performance of the present invention is shown. FIG. 8 illustrates a noise figure versus frequency response up to 3.0 GHz. The noise figure is shown measured in dB. The present invention is shown with a solid line. The conventional approach is shown with a dotted line.

Figure 9:
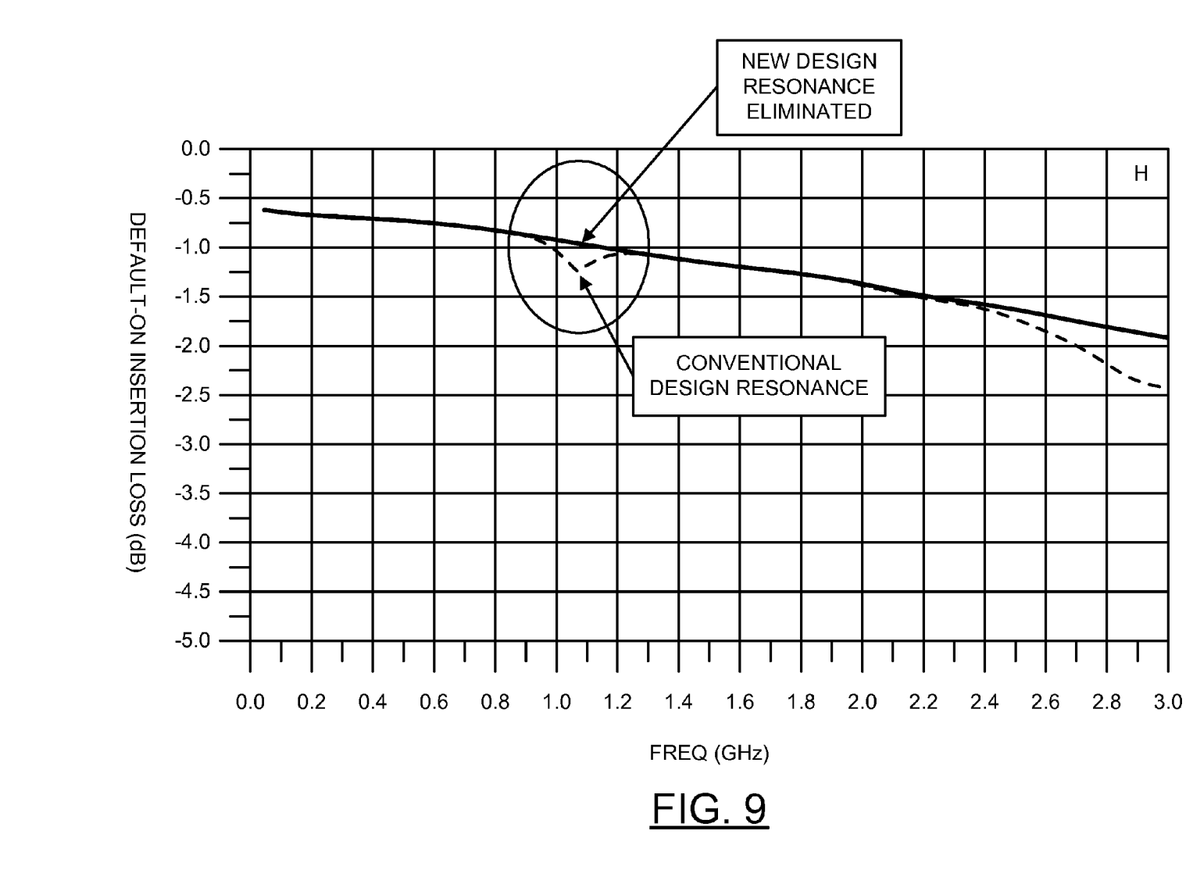
FIG. 9 is a simulated performance of a conventional approach versus the present invention.

Referring to FIG. 9, a simulated performance of a conventional design versus the present invention is shown. A default-on insertion loss versus frequency response in an unbiased state is illustrated. The frequency response is shown out to 3.0 GHz. The insertion loss is shown in db. The present invention is shown as a solid line. The conventional design is shown as a dotted line. The conventional design illustrates the resonance between 1.0 and 1.2 GHz. The present invention does not illustrate such a resonance.

Figure 10:
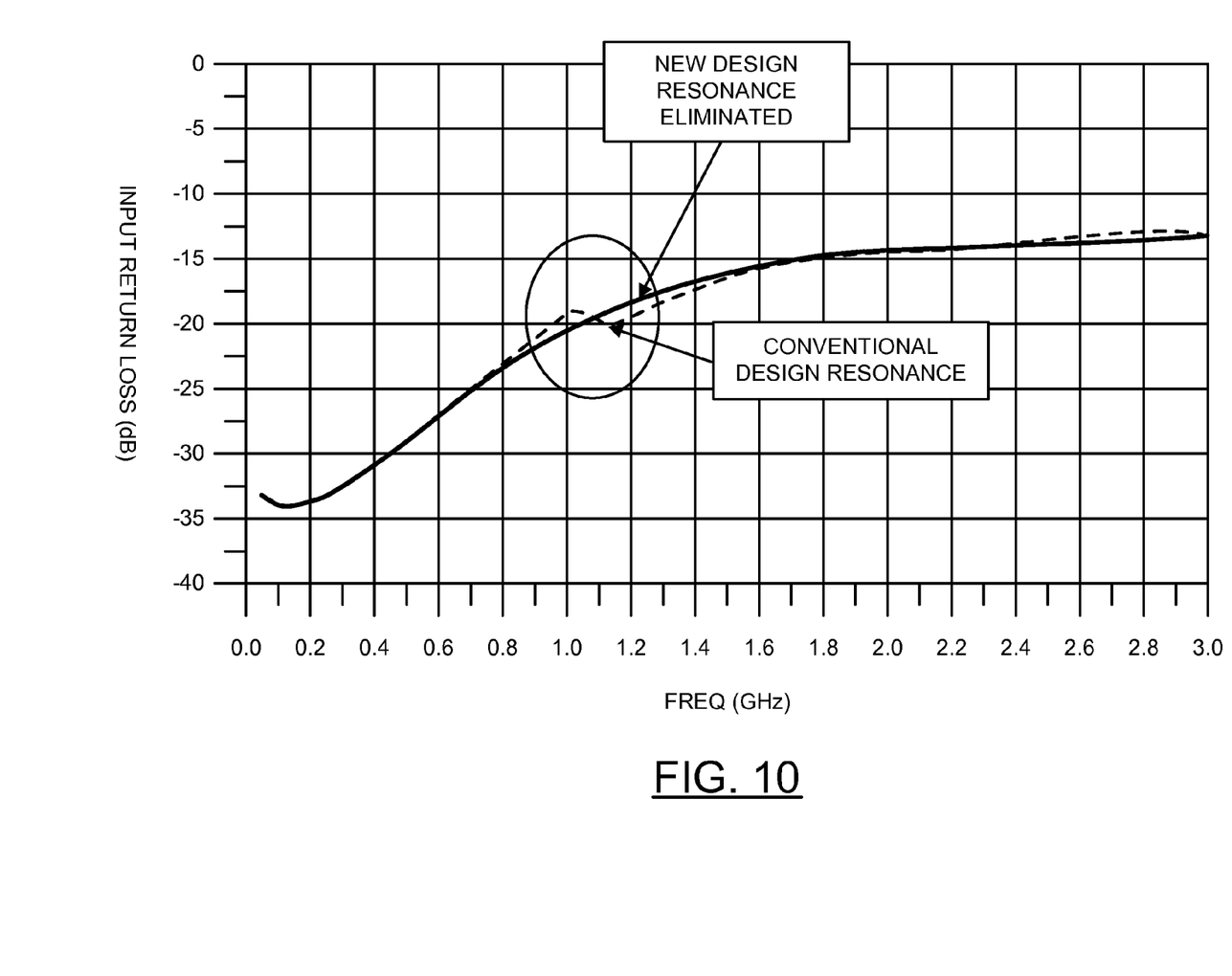
FIG. 10 is a simulated performance of a conventional approach versus the present invention.

Referring to FIG. 10, a simulated performance of a conventional design versus the present invention is shown illustrating input return loss versus frequency response in an unbiased state. The invention is shown as a solid line. The conventional design is shown as a dotted line. The conventional design illustrates a resonance between 1.0 and 1.2 GHz. The present invention does not have such a resonance.

Figure 11:
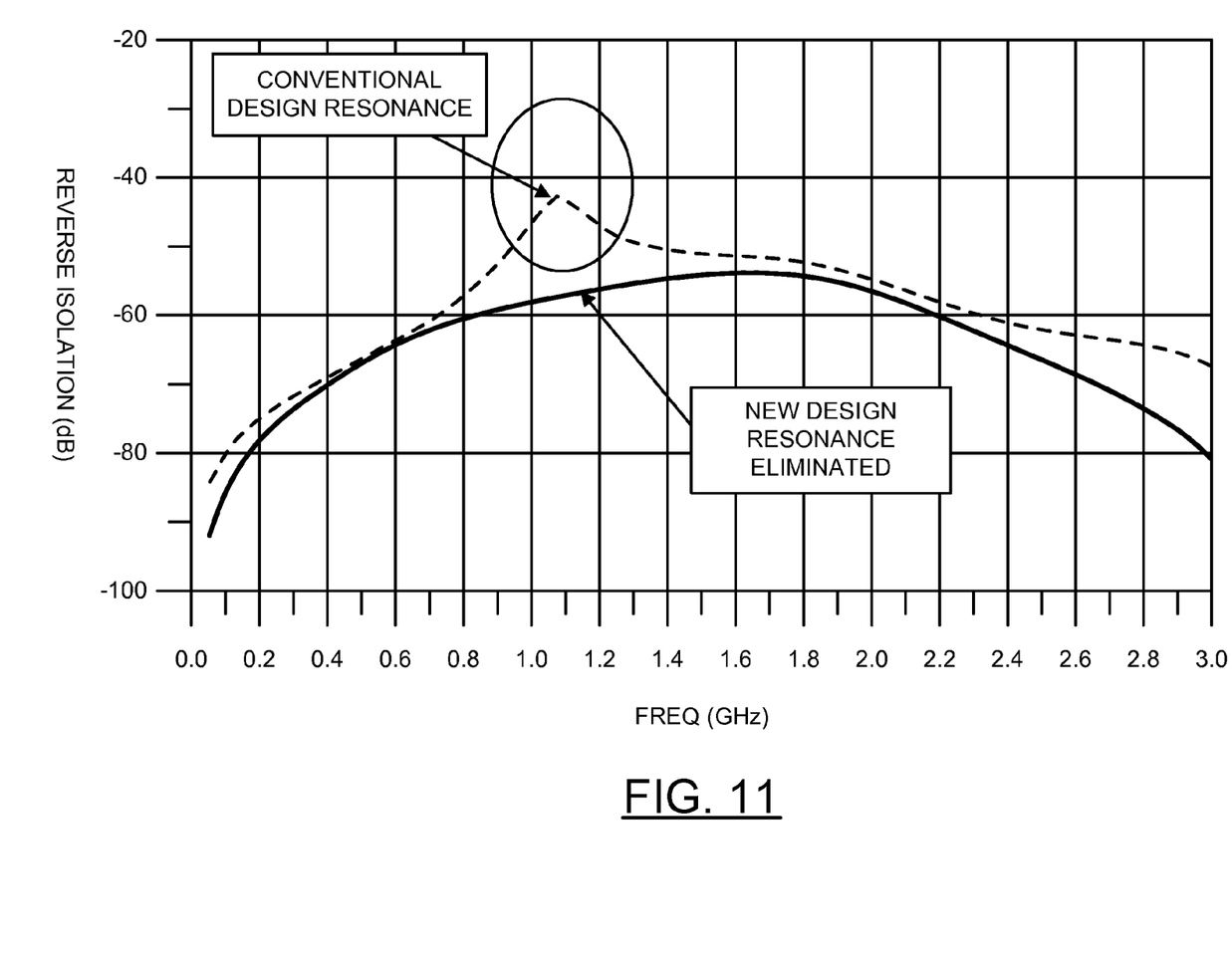
FIG. 11 is a simulated performance of a conventional approach versus the present invention.

Referring to FIG. 11, a simulation of a conventional design versus the present invention is shown illustrating a typical reverse isolation of one of the signals OUT2a-OUT2n versus frequency response in an unbiased state is shown. The reverse isolation is shown in dB. The frequency response is shown out to 3.0 GHz. The present invention is shown with solid lines. The conventional design is shown with dotted lines. The conventional design illustrates a resonance between 1.0 and 1.2 GHz. The present invention does not illustrate such a resonance.

Figure 12:
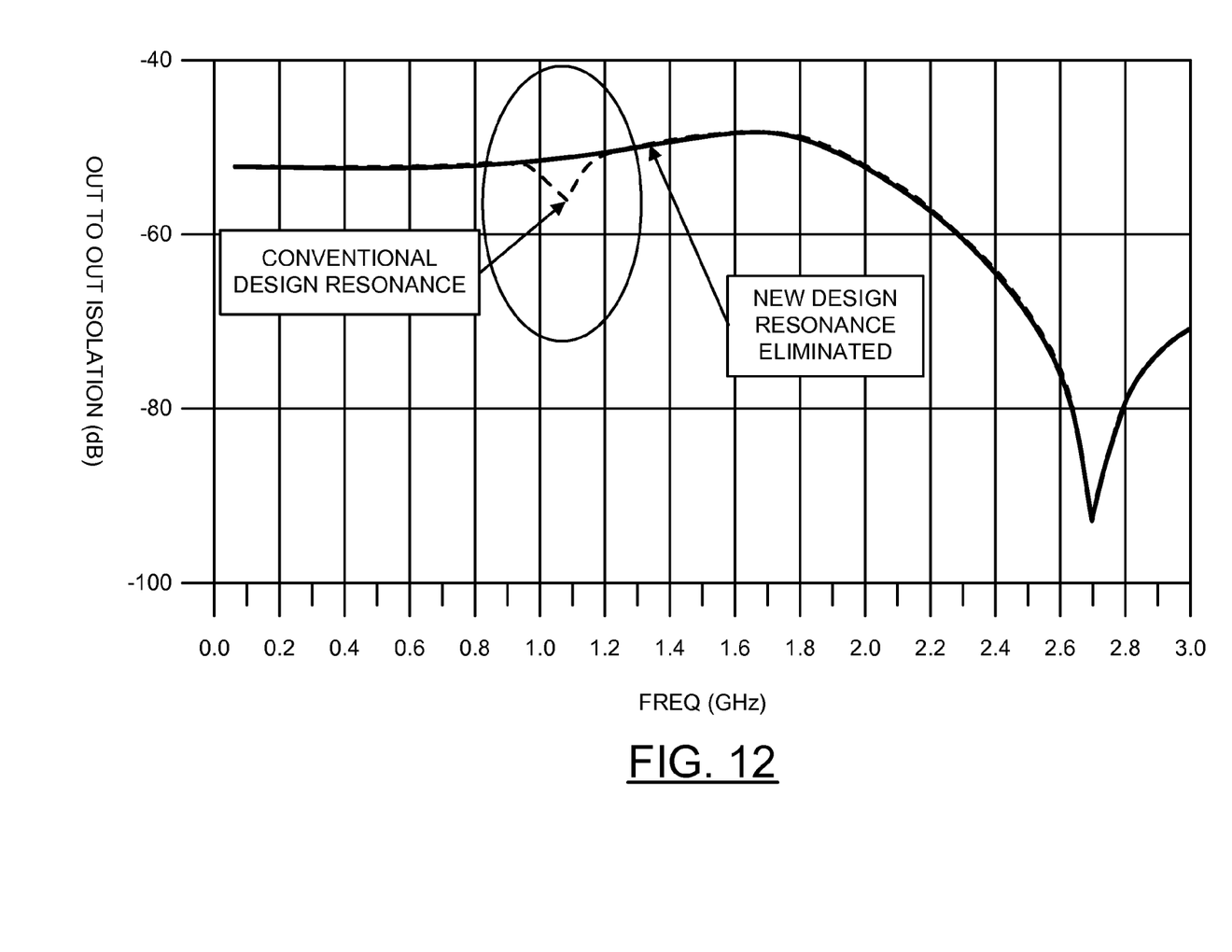
FIG. 12 is a simulated performance of a conventional approach versus the present invention.

Referring to FIG. 12, a simulation of the present invention versus a conventional approach is shown illustrating an out-to-out isolation of one of the signals OUTa-OUTn versus frequency response in an unbiased state. The out-to-out isolation is shown measured in dB. The frequency response is shown in GHz out to 3.0 GHz. The present invention is shown in solid lines, where the conventional approach is shown in dotted lines. The conventional approach shows the resonance between 1.0 and 1.2 GHz. The present invention does not show such a resonance.

While the circuit 100 has been described as being implemented with pHEMT transistors, the particular type of transistor device implemented may be varied to meet the design criteria of a particular implementation. For example, a CMOS process, or other process such as Gallium Nitride (GaN), GaN HEMT (e.g., MOSFET or MESFET), or other process technologies may be implemented. In general, the particular process used to implement the circuit 100 generally supports a "normally on" or "normally off" type transistor device.

The various signals of the present invention are generally "on" (e.g., a digital HIGH, or 1) or "off" (e.g., a digital LOW, or 0). However, the particular polarities of the on (e.g., asserted) and off (e.g., de-asserted) states of the signals may be adjusted (e.g., reversed) accordingly to meet the design criteria of a particular implementation.

Additionally, inverters may be added to change a particular polarity of the signals. As used herein, the term "simultaneously" is meant to describe events that share some common time period but the term is not meant to be limited to events that begin at the same point in time, end at the same point in time, or have the same duration.

While the invention has been particularly shown and described with reference to the preferred embodiments thereof, it will be understood by those skilled in the art that various changes in form and details may be made without departing from the scope of the invention.

The invention claimed is:

1. An apparatus comprising:
   an amplifier configured to generate a plurality of output signals in response to an input signal; and
   a switch network configured to provide (i) a first path when a power signal is not present and (ii) a second path when said power signal is present, wherein (i) said first path activates only a first of said plurality of output signals, (ii) said second path activates all of said plurality of output signals, (iii) an impedance is connected to said amplifier only when said first path is activated and (iv) said apparatus comprises a switch configuration for implementing a default-on N-way active splitter, wherein N is an integer.

2. The apparatus according to claim 1, wherein said plurality of output signals have a similar frequency characteristic as said input signal.

3. The apparatus according to claim 1, wherein said apparatus operates on a secondary power source received from a battery when said power signal is not present.

4. The apparatus according to claim 1, wherein said switch network is implemented using a plurality of first devices and a plurality of second devices.

5. The apparatus according to claim 4, wherein said plurality of first devices are implemented as normally-on devices and said second plurality of devices are implemented as normally-off devices.

6. The apparatus according to claim 4, wherein said first devices and said second devices are configured to automatically switch between said first path and said second path in response to said power signal being present.

7. The apparatus to claim 5, wherein said first plurality of devices comprise E-FET devices and said second plurality of devices comprise D-FET devices.

8. The apparatus according to claim 1, further comprising a back-up power source configured to operate said apparatus once said power signal is not present.

9. The apparatus according to claim 7, wherein said power signal is not present during an electrical outage at a premise where said apparatus is installed.

10. The apparatus according to claim 1, wherein said switch networks further comprises:
    a delay circuit implemented in said second paths, such that said first path and said second path have a similar length.

11. The apparatus according to claim 1, wherein said first output comprises a signal on a coaxial cable and said plurality of second outputs comprises a plurality of signals each on a respective coaxial cable.

12. The apparatus according to claim 1, wherein said first output comprises a signal within a gateway device and said plurality of second outputs comprises a signal within said gateway device.

13. The apparatus according to claim 1, wherein said power signal is generated in response to an AC power signal being present or not present.

14. A method for implementing a switch configuration having a default-on N-way active splitter, comprising the steps of:

generating a plurality of output signals in response to an input signal;
providing a first path when a power signal is not present; and
providing a second path when said power signal is present, wherein (i) said first path activates only a first of said plurality of output signals, (ii) said second path activates all of said plurality of output signals, (iii) an impedance is connected to said amplifier only when said first path is activated and (iv) said method comprises a switch configuration for implementing the default-on N-way active splitter, wherein N is an integer.

15. An apparatus comprising:
an amplifier configured to generate a plurality of output signals in response to an input signal; and
a switch network configured to provide (i) a first path when a power signal is not present and (ii) a second path when said power signal is present, wherein (i) said first path activates only a first of said plurality of output signals, (ii) said second path activates all of said plurality of output signals, (iii) an impedance is connected to said amplifier only when said first path is activated and (iv) said apparatus operates on a secondary power source received from a battery when said power signal is not present.

16. An apparatus comprising:
an amplifier configured to generate a plurality of output signals in response to an input signal;
a switch network configured to provide (i) a first path when a power signal is not present and (ii) a second path when said power signal is present, wherein (i) said first path activates only a first of said plurality of output signals, (ii) said second path activates all of said plurality of output signals and (iii) an impedance is connected to said amplifier only when said first path is activated; and
a back-up power source configured to operate said apparatus once said power signal is not present.

17. An apparatus comprising:
an amplifier configured to generate a plurality of output signals in response to an input signal; and
a switch network configured to provide (i) a first path when a power signal is not present and (ii) a second path when said power signal is present, wherein (i) said first path activates only a first of said plurality of output signals, (ii) said second path activates all of said plurality of output signals, (iii) an impedance is connected to said amplifier only when said first path is activated and (iv) said switch network is implemented using a plurality of first devices and a plurality of second devices.

* * * * *